(12) United States Patent
Park

(10) Patent No.: US 6,744,489 B2
(45) Date of Patent: Jun. 1, 2004

(54) SEMICONDUCTOR EXPOSURE APPARATUS AND METHOD OF DRIVING THE SAME

(75) Inventor: Soon-Jong Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 6 days.

(21) Appl. No.: 10/147,581

(22) Filed: May 17, 2002

(65) Prior Publication Data

US 2002/0176060 A1 Nov. 28, 2002

(30) Foreign Application Priority Data

May 24, 2001 (KR) ......................................... 2001-28719

(51) Int. Cl.[7] ......................... G03B 27/52; G01N 21/00
(52) U.S. Cl. ................. 355/30; 356/237.4; 356/237.5
(58) Field of Search .................. 355/30, 53; 356/237.1, 356/237.3, 237.4, 237.5, 335, 336

(56) References Cited

U.S. PATENT DOCUMENTS

| | | | | |
|---|---|---|---|---|
| 5,098,191 A | * | 3/1992 | Noguchi et al. | 356/237.1 |
| 5,652,657 A | * | 7/1997 | Yoshii et al. | 356/394 |
| 5,963,316 A | * | 10/1999 | Miura et al. | 356/237.3 |
| 6,084,664 A | * | 7/2000 | Matsumoto et al. | 356/237.4 |
| 6,466,315 B1 | * | 10/2002 | Karpol et al. | 356/237.4 |
| 6,521,889 B1 | * | 2/2003 | Ina et al. | 250/306 |
| 2003/0003035 A1 | * | 1/2003 | Stamires et al. | 422/225 |

* cited by examiner

Primary Examiner—Alan Mathews
(74) Attorney, Agent, or Firm—Mills & Onello LLP

(57) ABSTRACT

A semiconductor exposure apparatus includes a light exposure portion irradiating light on a semiconductor wafer through a reticle; a pellicle particle detector detecting a particle existing on a surface of the reticle; a particle cleaner cleaning the reticle when the particle exists on the surface of the reticle; a robot arm moving the reticle to a desired location in response to a control signal generated from a main controller; and the main controller controlling an operation of the semiconductor exposure apparatus.

11 Claims, 10 Drawing Sheets

SEMICONDUCTOR EXPOSURE APPARATUS AND METHOD OF DRIVING THE SAME

BACKGROUND OF THE INVENTION

1. Field of the Invention

The present invention relates to a semiconductor exposure apparatus and a method of driving the same.

2. Description of Related Art

A semiconductor manufacturing process includes a photolithography process to form a pattern. The photolithography process includes a light exposure process to irradiate light on a reticle to copy the same pattern as the reticle on photoresist coated on a semiconductor wafer. In the light exposure process, it is very important to remove particles remaining on the reticle.

FIG. 1 is a perspective view illustrating a conventional semiconductor exposure apparatus. The semiconductor exposure apparatus includes a light exposure unit 2 for performing a light exposure process to copy a pattern of the reticle on the photoresist coated on the semiconductor wafer.

The light exposure unit 2 includes a lighting portion 10 having a light source and a reflex mirror, a reticle table 12 in which a reticle having a circuit pattern is placed, and a projection lens (not shown) for focusing light passing through the reticle and irradiating it on the semiconductor wafer.

A reticle loader 20 is arranged at a location facing the light exposure portion 2. The reticle loader 20 includes slots 22 in which a plurality of reticles 24 are inserted and stacked.

A pellicle particle detector 30 is arranged under the reticle loader 20 as shown in FIG. 3. The pellicle particle detector 30 irradiates a laser beam on the top surface or the bottom surface of the reticle 24 through an opened door 32 thereof and detects scattered the laser beam so as to detect particles remaining on a top surface or a bottom surface of the reticle 24.

A robot arm 40 is arranged between the light exposure portion 2 and the reticle loader 20 as shown in FIG. 2. The robot arm 40 transfers the reticle 24 stacked in the reticle loader 20 to the pellicle particle detector 30 while moving up and down or left and right. After detection of particles is finished, the robot arm 40 transfers the reticle in the pellicle particle detector 30 to the reticle table 12 and transfers the reticle 24 on the reticle table 12 to the reticle loader 2.

The robot arm 40 is coupled to a second driving unit 45. The second driving unit 45 is arranged to be guided by a moving rail 44. A pair of first driving units 43a and 43b is coupled to both end portions of the moving rail 44. The first driving units 43a and 43b are arranged to be guided by a pair of stationary rails 42a and 42b spaced apart from each other. That is, the robot arm 40 moves up and down along the stationary rails 42a and 42b by the driving units 43a and 43b and moves left and right along the moving rail 44 by the driving units 45.

When it is determined by the pellicle particle detector 30 that particles do not exist on the reticle 24, the robot arm 40 transfers the reticle 24 in the pellicle particle detector 30 to the light exposure portion 2. The lighting portion 10 of the light exposure portion 2 irradiates light on the reticle 24 on the reticle table 12, and light passing through the reticle 24 is irradiated on the photoresist coated on the semiconductor wafer through the projection lens, whereby the photoresist is exposed to light.

When it is determined that particles exist on the reticle 24, the reticle 24 in the pellicle particle detector 30 is drawn out by the robot arm 40. The reticle 24 is transferred and stacked on the reticle loader 20 by the robot arm 40. The reticles 24 on the reticle loader 20 are transferred to a cleaning room, thereby cleaning the reticle 24 using, for example, an air gun. The cleaned reticle 24 is then stacked on the reticle loader 20 and is loaded into the pellicle particle detector 30 by the robot arm 40. The pellicle particle detector 30 detects whether particles remain on the reticle 24. The reticles 24 having particles are transferred to the reticle table 12 by the robot arm 40.

However, the conventional semiconductor exposure apparatus does not include a cleaning apparatus which can clean the reticle 24 having particles directly after detecting whether particles exist on the reticle 24. Therefore, exposure process time is lengthy because the reticle having particles has to be transferred to the cleaning room.

In addition, the cleaning process is performed such that the entire surface of the reticle is cleaned by the air gun without considering the particle size, the particle location, and so on. Consequently, reticle cleaning cannot be performed efficiently.

SUMMARY OF THE INVENTION

To overcome the problems described above, preferred embodiments of the present invention provide a semiconductor exposure apparatus which can perform a cleaning process directly after detecting whether particles exist on a reticle.

It is another object of the present invention to provide a semiconductor exposure apparatus which can remove particles remaining on a reticle efficiently.

The present invention is directed to a semiconductor exposure apparatus, comprising: a light exposure portion irradiating light on a semiconductor wafer through a reticle; a pellicle particle detector detecting a particle existing on a surface of the reticle; a particle cleaner cleaning the reticle when the particle exists on the surface of the reticle; a robot arm moving the reticle to a desired location in response to a control signal generated from a main controller; and the main controller controlling an operation of the semiconductor exposure apparatus.

The reticle cleaner includes nozzles exhausting a filtered gas such as air at a predetermined pressure. The nozzles move to a location to efficiently remove the particle on the reticle according to a detection resulting signal of the pellicle particle detector. The nozzles move up and down or left and right by driving units, the driving units being guided along rails. The nozzles rotate at a predetermined angle by a driving unit, the driving unit being guided along rails. The nozzles have an inclined cross-section.

The nozzles are arranged to remove the particles on both of a top surface and a bottom surface of the reticle.

The semiconductor exposure apparatus further includes a particle removing unit arranged in front of an inlet of the pellicle particle detector to remove the particle on the reticle. The particle removing unit includes a plurality of nozzles, the pluraliy of the nozzles exhausting a filtered gas such as air at a constant pressure to remove the particle on the reticle. The nozzles have a cross-section inclined in a direction opposite to a direction that the reticle is loaded into the pellicle particle detector. The particle removing unit further includes an air filter filtering an air and an air pressure controller controlling a pressure of an air exhausted through the nozzles.

The present invention further provides a method of driving a semiconductor exposure apparatus, comprising: a)

loading a reticle into a pellicle particle detector; b) detecting a particle existing on the reticle by the pelliticle particle detector; c) moving the reticle to a cleaning location when the reticle exists on the reticle; d) moving a reticle cleaner to the reticle; and e) cleaning the reticle by the reticle cleaner.

The method further includes removing the particle on the reticle directly before the reticle is loaded into the pellicle particle detector.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
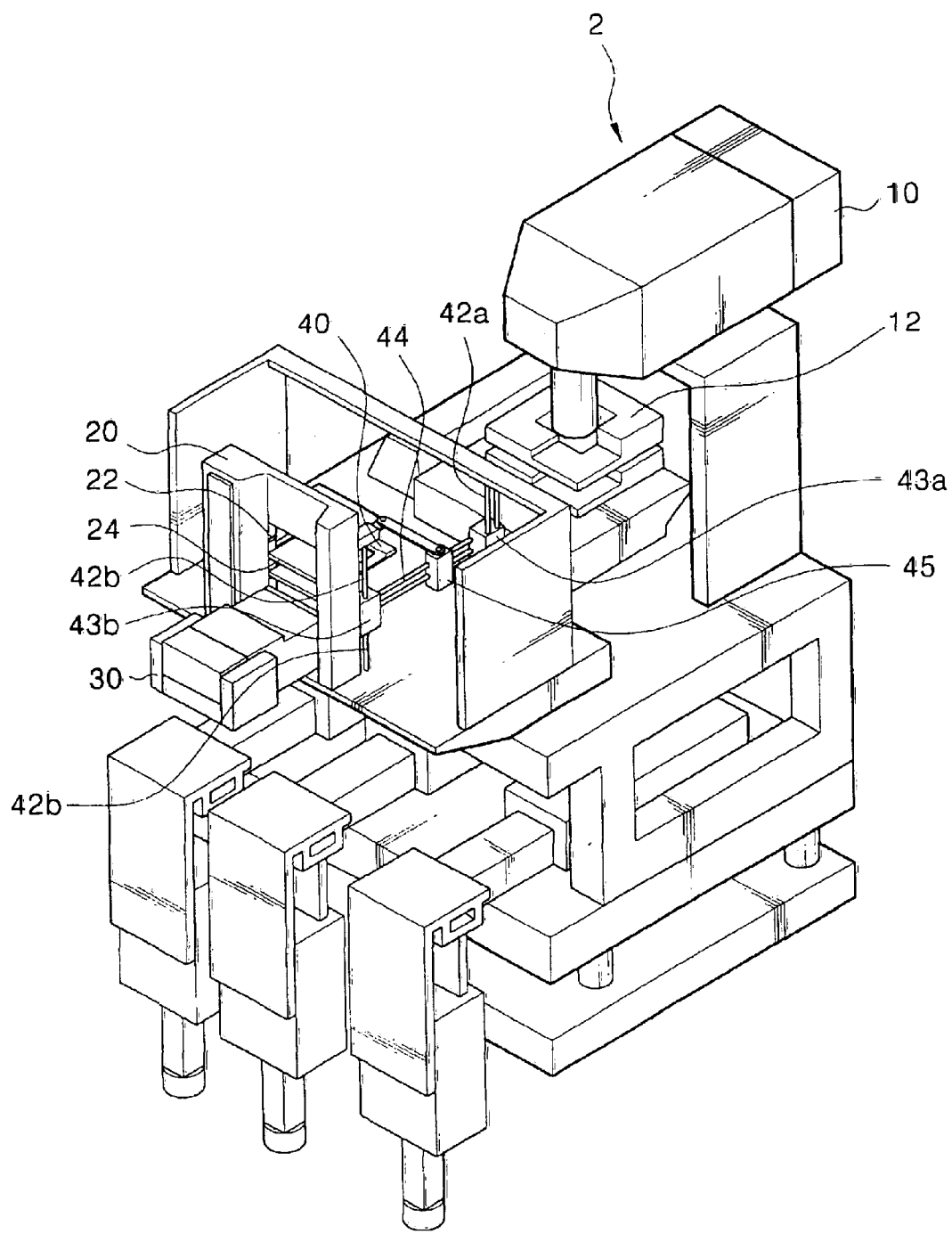
FIG. 1 is a perspective view illustrating a conventional semiconductor exposure apparatus.
Figure 2:
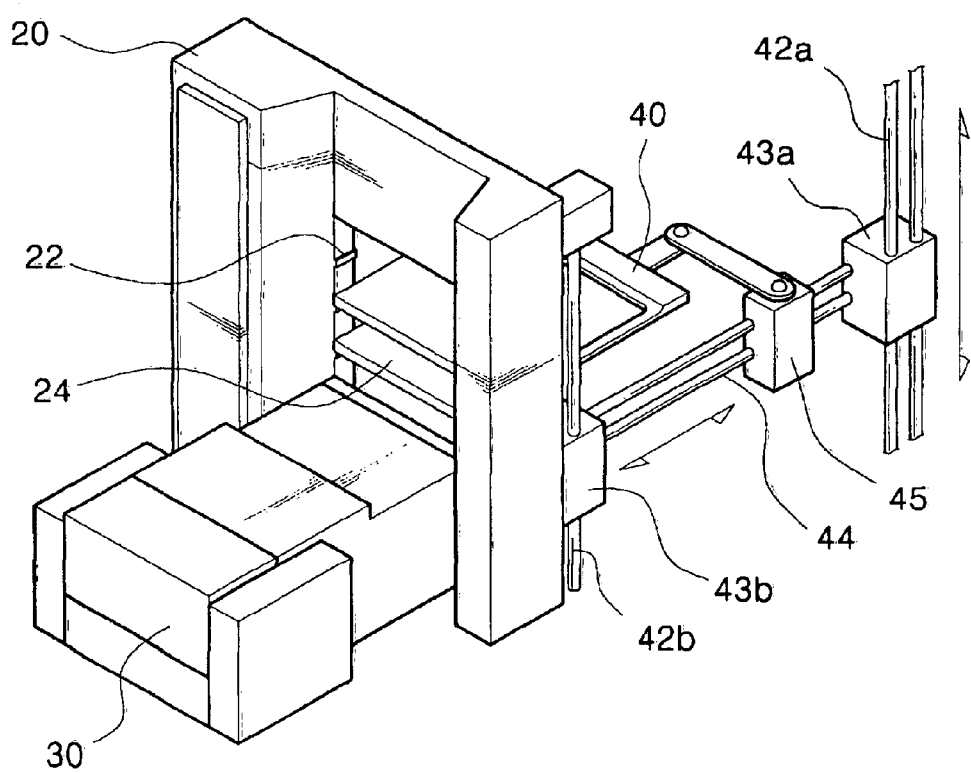
FIG. 2 is a perspective view illustrating a reticle loader of the semiconductor exposure apparatus of FIG. 1.
Figure 3:
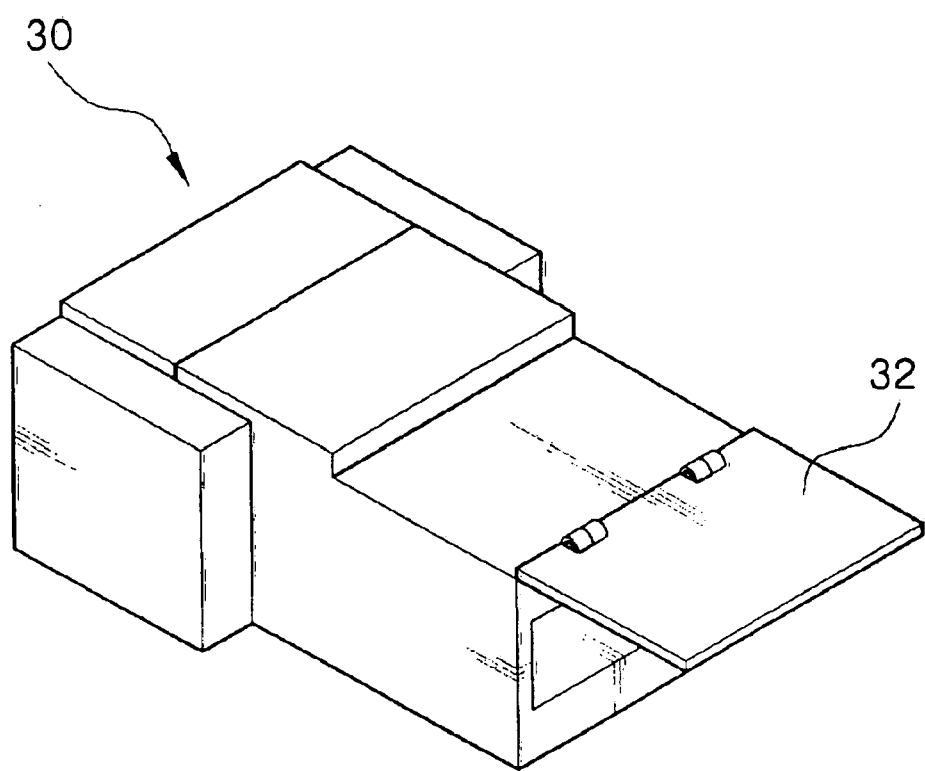
FIG. 3 is a perspective view illustrating a pellicle particle detector of the semiconductor exposure apparatus of FIG. 1.
Figure 4:
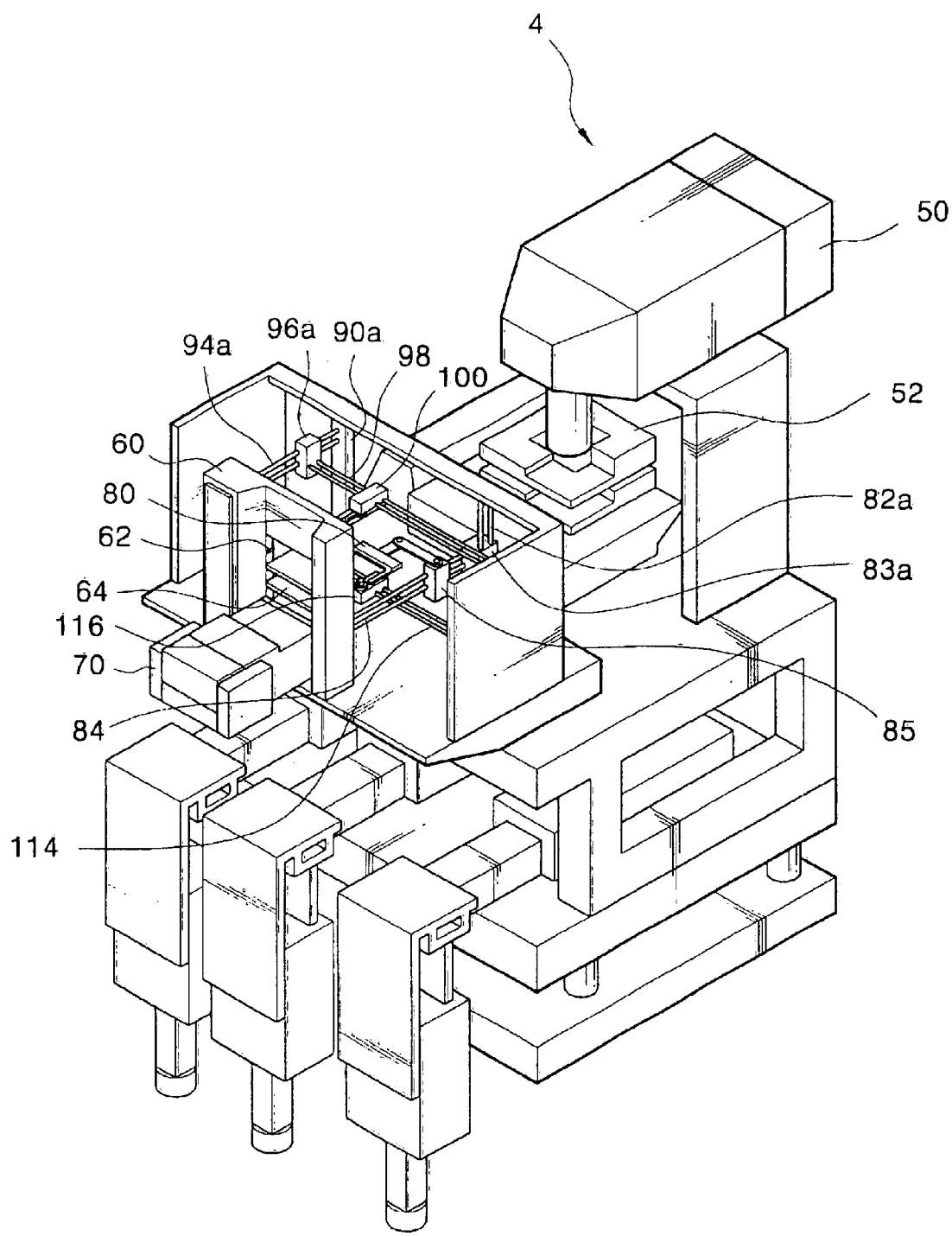
FIG. 4 is a perspective view illustrating a semiconductor exposure apparatus according to the present invention.

FIG. 4 is a perspective view illustrating one embodiment of a semiconductor exposure apparatus according to the present invention. The semiconductor exposure apparatus of FIG. 4 includes a light exposure unit 4. The light exposure unit 4 includes a lighting portion 50 having a light source and a reflex mirror. A reticle table 52 is arranged under the lighting portion 50. A reticle 64 having a circuit pattern is placed on the reticle table 52. A projection lens (not shown) for focusing light passing through the reticle 64 and irradiating it on the semiconductor wafer is arranged under the reticle table 52.

A reticle loader 60 is arranged at a location facing the light exposure portion 4. The reticle loader 60 includes slots 62 in which a plurality of reticles 64 are inserted and stacked.

A pellicle particle detector 70 is arranged under the reticle loader 60. The pellicle particle detector 70 irradiates a laser beam on the top surface and the bottom surface of the reticle 64 in an inlet (not shown) thereof, and detects the scattered laser beam so as to detect particles remaining on a top surface or a bottom surface of the reticle 64.

A robot arm 80 is arranged between the light exposure portion 4 and the reticle loader 60. The robot arm 80 moves up and down or right and left to transfer the reticle 64 to a desired location.

A particle removing unit is arranged in front of the pellicle particle detector 70. The particle removing unit serves to remove particles on the reticle 64 before performing a detection as to whether the particles exist on the reticle 64.

Figure 5:
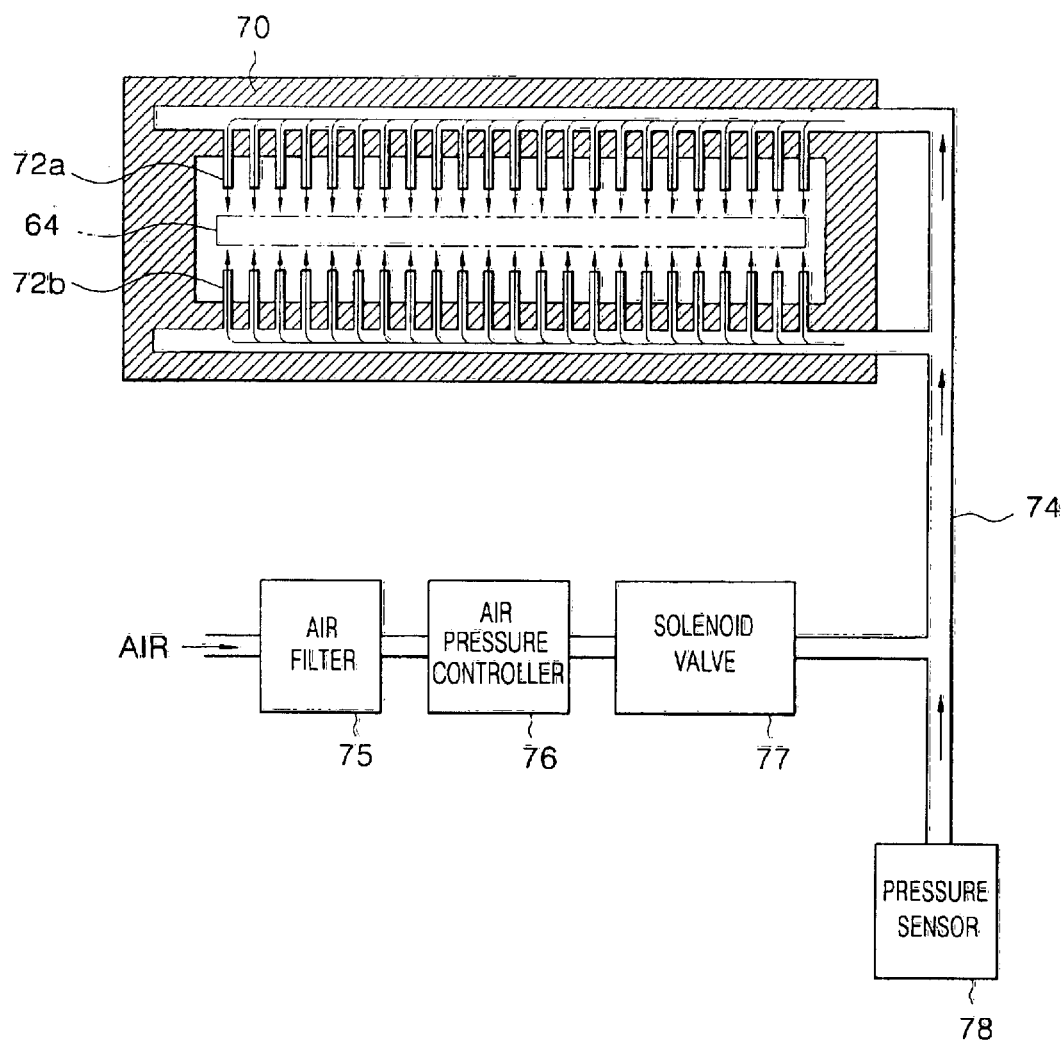
FIG. 5 is a schematic view illustrating a configuration of a particle removing unit according to the present invention.
Figure 6:
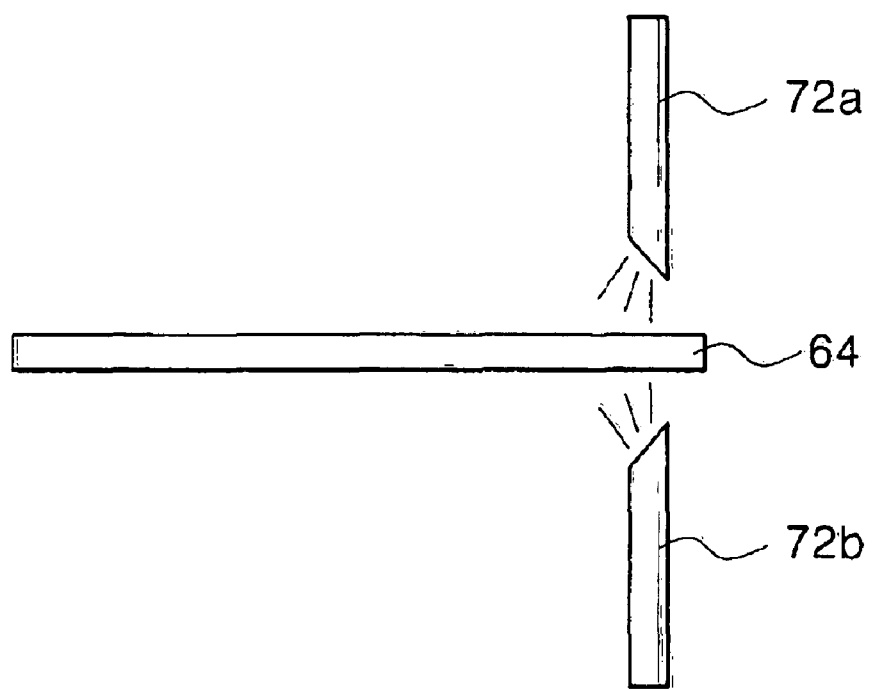
FIG. 6 shows a nozzle having an inclined cross-section.

FIG. 5 is a schematic view illustrating a configuration of the particle removing unit according to the present invention. An air filter 75 filters air flowing into an air supplying line 74. An air pressure controller 76 controls pressure of air exhausted through the nozzles 72a and 72b. A solenoid valve 77 controls flow of air in the air supplying line 74. A pressure sensor 78 senses pressure of air exhausted so as to make exhausted air pressure constant. A plurality of nozzles 72a and 72b are arranged side by side in front of the inlet of the pellicle particle detector 70. The nozzles 72a and 72b exhaust gas such as nitrogen gas at a predetermined air pressure. The nozzles 72a and 72b have a cross-section inclined in a direction opposite to the inlet of the pellicle particle detector 70 so as to efficiently remove particles from the surface of the reticle 64 as shown in FIG. 6.

Figure 7:
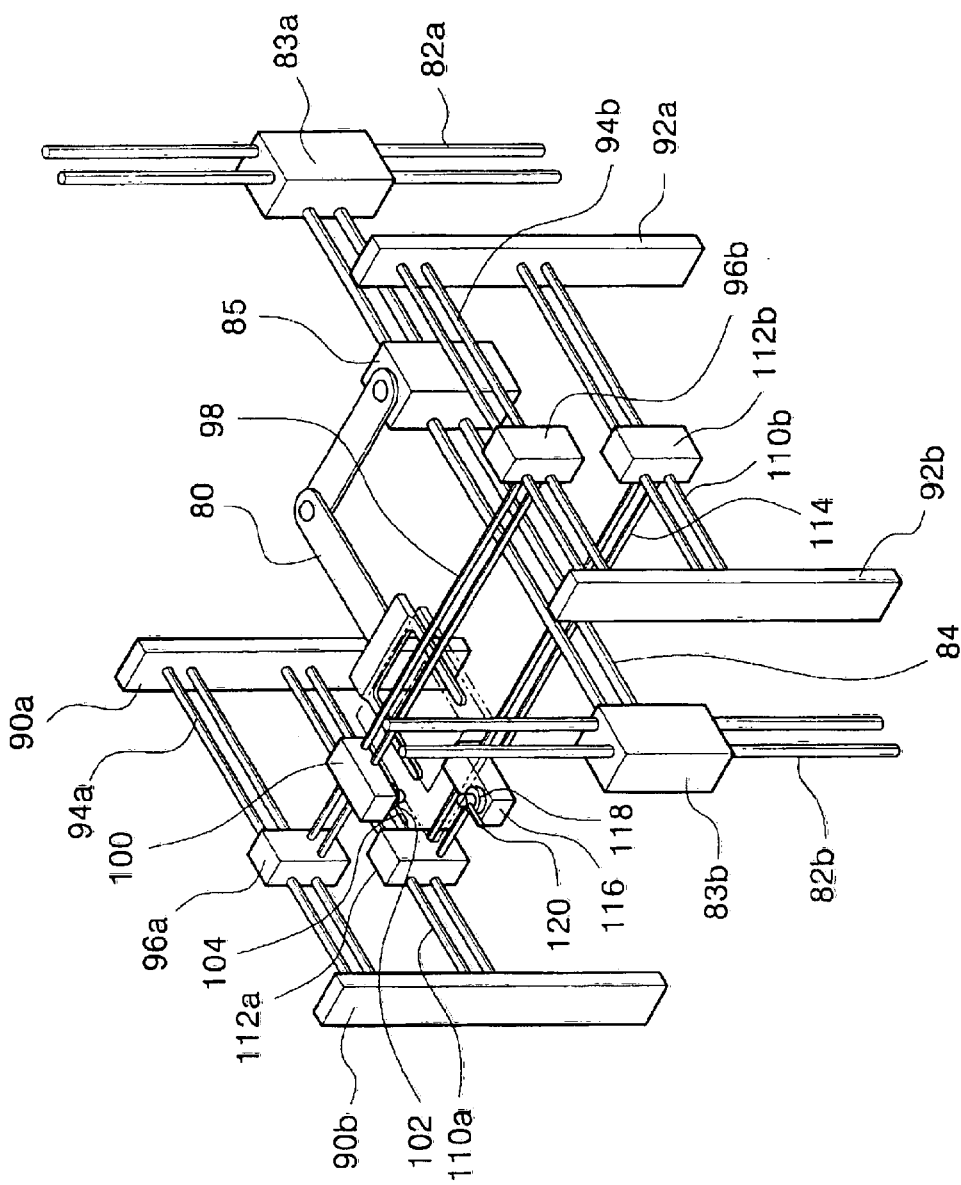
FIG. 7 is a schematic view illustrating a robot arm and a reticle cleaner.

FIG. 7 is a schematic view illustrating the robot arm 80 and a reticle cleaner according to the invention.

The robot arm 80 is coupled to a driving unit 85. The driving unit 85 is guided along a moving rail 84 and moves the robot arm 80 right and left. A pair of driving units 83a and 83b is coupled to both end portions of the moving rail 84. The driving units 83a and 83b are guided along a pair of stationary rails 82a and 82b, respectively, and move the robot arm 80 up and down.

A pair of rail supports 90a and 90b is arranged in front of the robot arm 80 to support the stationary rails 94a and 110a. A pair of supports 92a and 92b is arranged in the rear of the robot arm 80 to support stationary rails 94b and 110b.

Driving units 96a and 96b are guided along the stationary rails 94a and 94b, respectively. Driving units 112a and 112b are guided along the stationary rails 110a and 110b, respectively. A stationary rail 98 is coupled to the driving units 96a and 96b, and a stationary rail 114 is coupled to the driving units 112a and 112b.

A driving unit 100 is guided along the stationary rail 98. A driving unit 116 is guided along the stationary rail 114. Driving units 102 and 118 are arranged on opposite surfaces of the driving units 102 and 116, respectively. The driving units 102 and 118 serve to rotate a reticle cleaner at a predetermined angle.

The reticle cleaner includes nozzles 104 and 120 for exhausting a clean gas such as a filtered nitrogen gas at a predetermined pressure. It should be noted that throughout this description, where the gas is referred to as air, gases other than air, such as the filtered nitrogen gas, can be used. Preferably, the nozzles 104 and 120 have an inclined cross-section so as to easily clean particles remaining on the reticle 64.

Figure 8:
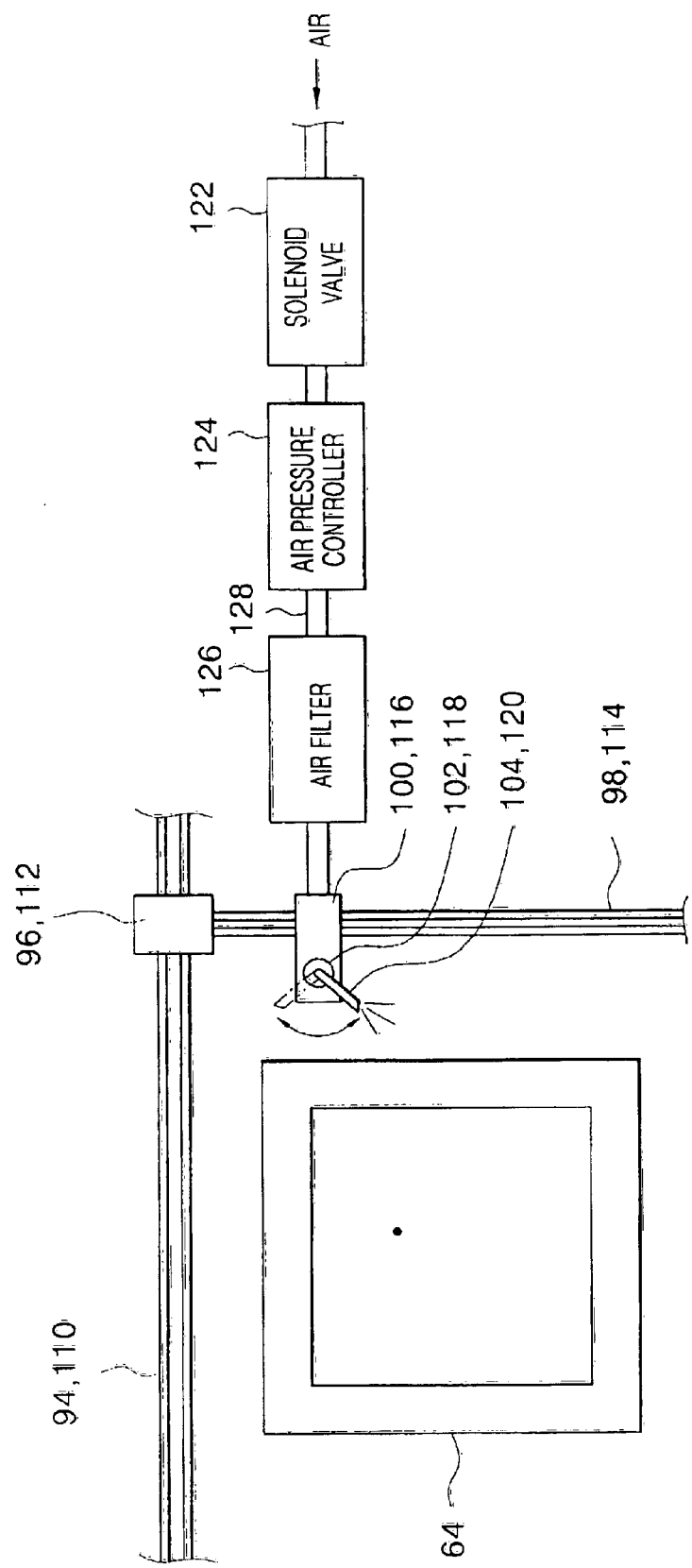
FIG. 8 is a schematic view illustrating a configuration of the reticle cleaner.

FIG. 8 is a schematic view illustrating a configuration of the reticle cleaner.

A solenoid valve 122 controls a flow of the gas or air flowing into a gas or air supplying line 128. When an ON signal is applied, the solenoid valve 122 is opened to allow air flow to the nozzles 104 and 120. An air pressure controller 122 controls pressure of air exhausted through the nozzles 104 and 120 from the air supplying line 128. An air filter 126 filters air flowing into the air supplying line 128, and thus air exhausted from the nozzles 104 and 120 becomes clean.

Figure 9:
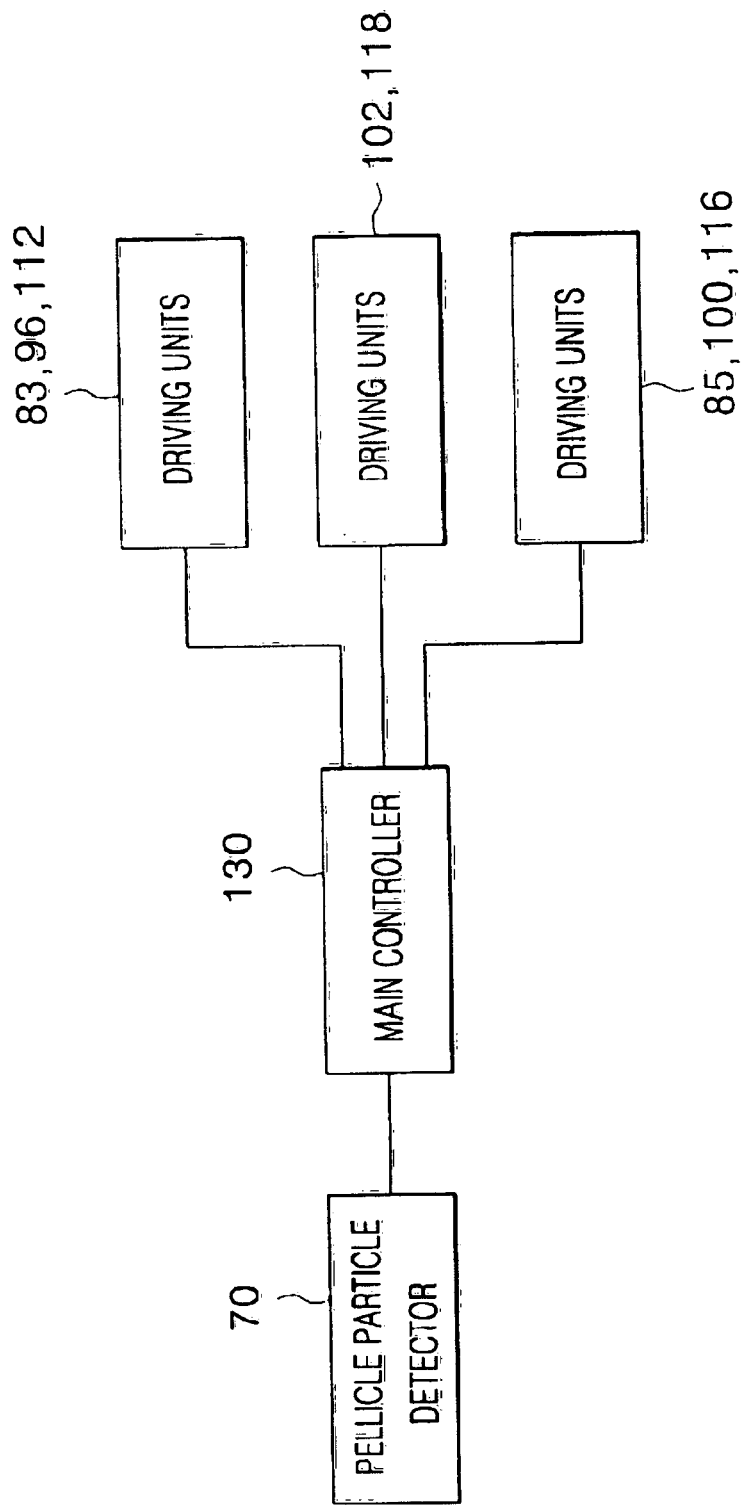
FIG. 9 is a block diagram illustrating operation of the reticle cleaner and the robot arm according to the present invention.

FIG. 9 is a block diagram illustrating operation of the reticle cleaner and the robot arm 80 according to the present invention.

A detection resulting signal of the pellicle particle detector 70 is applied to a main controller 130. In response to the detection resulting signal, the main controller 130 operates the driving units 83a, 83b, and 85 to control a movement location of the robot arm 80, and operates the driving units 96a and 96b, 112a and 112b, 100 and 116, and 102 and 118 to control an air injecting location of the nozzles 104 and 120.

Figure 10:
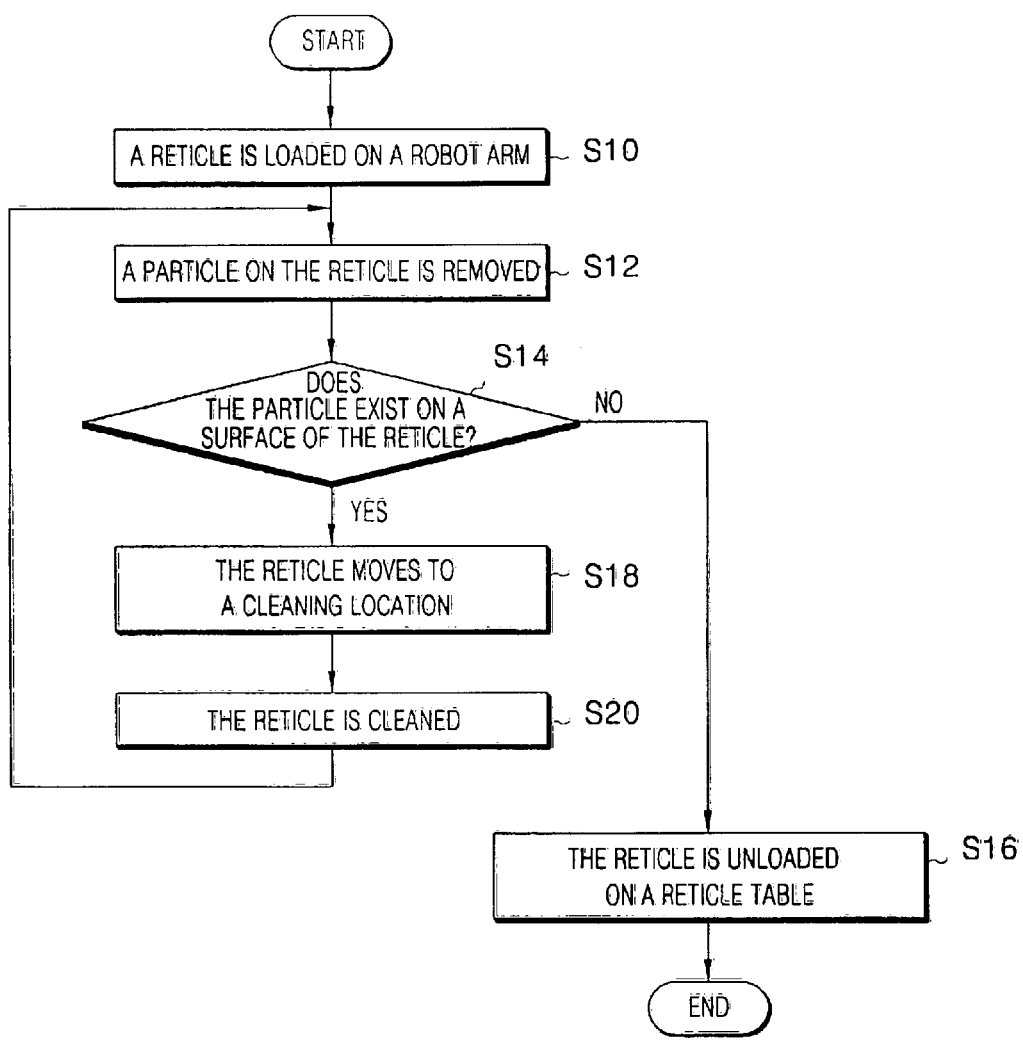
FIG. 10 is a flow chart illustrating operation of the semiconductor exposure apparatus according to the present invention.

FIG. 10 is a flow chart illustrating operation of the semiconductor exposure apparatus according to the present invention.

The robot arm 80 loads one of the reticles 64 stacked on the reticle loader 60 (step S10). The robot arm 80 transfers the loaded reticle 62 to the pellicle particle detector 70.

The reticle 64 is loaded into the pellicle particle detector 70, and at the same time, the particles on the reticle 64 are removed by the particle removing unit arranged in front of the inlet of the pellicle particle detector 70 using a pressure of an air exhausted from the nozzles 72a and 72b (step S12).

Thereafter, the pellicle particle detector 70 irradiates a laser beam to both sides of the reticle 47 therein and detects a scattered laser beam to detect the particles existing on the reticles 64 (step S14).

When it is determined that the particles do not exist on the reticle 64, the pellicle particle detector 70 produces a detection result signal to the main controller 130 so that the robot arm 80 unloads the reticle 64 on the reticle table 52 (step S16).

On the other hand, when it is determined that that the particles exist on the reticle 64, the pellicle particle detector 70 produces a detection result signal with particle information such as particle size and particle location to the main controller 130 so that the reticle 64 is positioned in the reticle cleaner (step S18). Namely, the main controller 130 operates the driving units 96a and 96b, 112a and 112b, 100 and 116, and 102 and 118 so that the nozzles 104 and 120 move to a location to efficiently remove the particles on the top surface and the bottom surface of the reticle 64.

Subsequently, the main controller 130 applies a signal to open the solenoid valve 124. The air pressure controller 122 controls pressure of air flowing into the air supplying line 128, and the air filter 126 filters air, so that clean air is exhausted through the nozzles 104 and 120 to clean the reticle 64 (step S20).

The main controller 130 operates the robot arm 80 to load the reticle 64 into the pellicle particle detector 70 to detect the particles existing on the reticle 64. Therefore, an operation of the semiconductor exposure apparatus proceeds to step 12.

As described herein, the semiconductor exposure apparatus according to the present invention has the following advantages. Since the semiconductor exposure apparatus includes a reticle cleaner formed unitarily therewith, the light exposure process time is shortened, thereby improving throughput. In addition, the cleaning process is performed using particle information such as particle size and particle location, reticle cleaning can efficiently be performed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor exposure apparatus, comprising:
    a light exposure portion irradiating light on a semiconductor wafer through a reticle;
    a pellicle particle detector detecting a particle on a surface of the reticle;
    a reticle cleaner cleaning the reticle when the particle is present on the surface of the reticle, the reticle cleaner including nozzles exhausting a filtered gas at a predetermined pressure;
    a robot arm moving the reticle to a desired location in response to a control signal generated from a main controller; and
    the main controller controlling an operation of the semiconductor exposure apparatus.

2. The apparatus of claim 1, wherein the nozzles move to a location to efficiently remove the particle on the reticle according to a detection resulting signal of the pellicle particle detector.

3. The apparatus of claim 2, wherein the nozzles are moved up and down or left and right by driving units, the driving units being guided along rails.

4. The apparatus of claim 3, wherein the nozzles are rotated at a predetermined angle by a driving unit, the driving unit being guided along rails.

5. The apparatus of claim 1, wherein the nozzles have an inclined cross-section.

6. The apparatus of claim 1, wherein the nozzles are arranged to remove the particles on both of a top surface and a bottom surface of the reticle.

7. The apparatus of claim 6, further comprising a particle removing unit arranged in front of an inlet of the pellicle particle detector to remove the particle on the reticle.

8. The apparatus of claim 7, wherein the particle removing unit includes a plurality of nozzles, the pluraliy of the nozzles exhausting a filtered gas at a constant pressure to remove the particle on the reticle.

9. The apparatus of claim 8, wherein the nozzles have a cross-section inclined in a direction opposite to a direction that the reticle is loaded into the pellicle particle detector.

10. The apparatus of claim 8, wherein the particle removing unit further includes a gas filter filtering a gas and a gas pressure controller controlling a pressure of a gas exhausted through the nozzles.

11. A method of driving a semiconductor exposure apparatus, comprising:
    a) loading a reticle into a pellicle particle detector;
    b) detecting a particle on the reticle using the pellicle particle detector;
    c) moving the reticle to a cleaning location when the particle is present on the reticle;
    d) moving a reticle cleaner to the reticle; and
    e) cleaning the reticle using the reticle cleaner, the reticle cleaner including nozzles exhausting a filtered gas at a predetermined pressure.

* * * * *